(12) United States Patent
Kwag et al.

(10) Patent No.: US 11,696,486 B2
(45) Date of Patent: Jul. 4, 2023

(54) MASK, METHOD FOR MANUFACTURING THE SAME, AND METHOD FOR MANUFACTURING DISPLAY PANEL

(71) Applicant: Samsung Display Co., LTD., Yongin-si (KR)

(72) Inventors: Jinoh Kwag, Yongin-si (KR);
Sungsoon Im, Suwon-si (KR);
Youngmin Moon, Yongin-si (KR);
Ji-Hee Son, Hwaseong-si (KR);
Seungyong Song, Suwon-si (KR);
DuckJung Lee, Hwaseong-si (KR);
Hye Yong Chu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 184 days.

(21) Appl. No.: 17/067,730

(22) Filed: Oct. 11, 2020

(65) Prior Publication Data

US 2021/0217997 A1    Jul. 15, 2021

(30) Foreign Application Priority Data

Jan. 13, 2020   (KR) .................. 10-2020-0004066

(51) Int. Cl.
| | |
|---|---|
| *H01L 51/56* | (2006.01) |
| *C23C 14/04* | (2006.01) |
| *H01L 51/00* | (2006.01) |
| *H01L 27/32* | (2006.01) |
| *H10K 71/00* | (2023.01) |
| *H10K 59/121* | (2023.01) |
| *H10K 71/16* | (2023.01) |

(52) U.S. Cl.
CPC ............ *H10K 71/00* (2023.02); *C23C 14/042* (2013.01); *H10K 59/121* (2023.02); *H10K 71/166* (2023.02)

(58) Field of Classification Search
CPC ................. C23C 14/042; H01L 51/001; H01L 51/00011
USPC ................................... 118/504, 505
See application file for complete search history.

(56) References Cited

U.S. PATENT DOCUMENTS 9,527,098 B2    12/2016  Hirobe et al.
2002/0062785 A1*  5/2002  Kim ...................... C23C 14/042
                                                        118/504

(Continued)

FOREIGN PATENT DOCUMENTS

JP            6142388         5/2017
KR    10-2014-0063805         5/2014

(Continued)

*Primary Examiner* — Victoria K. Hall
(74) *Attorney, Agent, or Firm* — H.C. Park & Associates, PLC

(57) ABSTRACT

Provided is a mask having a plurality of cell areas, each of which has a plurality of through-portions defined therein. The mask includes a mask film including a polymer and a conductive layer disposed on at least one surface of the mask film and including conductive metal or a conductive metal oxide. Accordingly, precision of a deposition process is enhanced while reducing process time and costs in a manufacturing process of the mask, and thus the yield in manufacturing a display panel using the mask is improved. Therefore, the display panel manufactured using the mask may have improved reliability.

16 Claims, 20 Drawing Sheets

(56) References Cited

U.S. PATENT DOCUMENTS

| | | | |
|---|---|---|---|
| 2005/0136668 A1* | 6/2005 | Yotsuya | H01L 51/0011 438/689 |
| 2015/0017321 A1 | 1/2015 | Kudo et al. | |
| 2015/0037928 A1* | 2/2015 | Hirobe | C23C 14/042 156/272.8 |
| 2015/0246416 A1* | 9/2015 | Mizumura | B23K 26/402 118/504 |
| 2015/0251205 A1* | 9/2015 | Hirobe | B05C 21/005 118/504 |
| 2015/0290667 A1* | 10/2015 | Mizumura | H01L 51/001 118/504 |
| 2015/0368785 A1* | 12/2015 | Nam | C23C 14/042 118/504 |
| 2016/0149133 A1* | 5/2016 | Kim | C23C 14/3407 204/192.28 |
| 2016/0293844 A1* | 10/2016 | Takeda | H01L 51/0011 |
| 2018/0009190 A1* | 1/2018 | Ochi | B32B 27/281 |
| 2018/0245199 A1* | 8/2018 | Nam | C23C 14/50 |
| 2018/0340252 A1* | 11/2018 | Vazan | C23C 16/4583 |
| 2019/0044068 A1* | 2/2019 | Jiang | H01L 51/001 |
| 2019/0044070 A1* | 2/2019 | Nishida | H01L 51/0011 |
| 2019/0126406 A1* | 5/2019 | Litoshenko | B23K 26/0626 |
| 2019/0203338 A1 | 7/2019 | Kawasaki et al. | |
| 2019/0221741 A1* | 7/2019 | Tang | G03F 7/0015 |
| 2019/0355938 A1* | 11/2019 | Chen | H01L 51/56 |
| 2020/0035923 A1 | 1/2020 | Kawasaki et al. | |
| 2020/0181755 A1* | 6/2020 | Kobayashi | H01L 51/0011 |
| 2020/0299821 A1* | 9/2020 | Nishida | C23C 14/24 |
| 2021/0013415 A1* | 1/2021 | Kawasaki | H01L 51/56 |
| 2021/0193928 A1* | 6/2021 | Sone | C23C 14/50 |
| 2021/0217956 A1* | 7/2021 | Im | C23C 14/042 |

FOREIGN PATENT DOCUMENTS

| | | |
|---|---|---|
| KR | 10-2019-0013852 | 2/2019 |
| KR | 10-2019-0058475 | 5/2019 |
| KR | 10-1972920 | 8/2019 |
| KR | 10-2019-0106733 | 9/2019 |

* cited by examiner

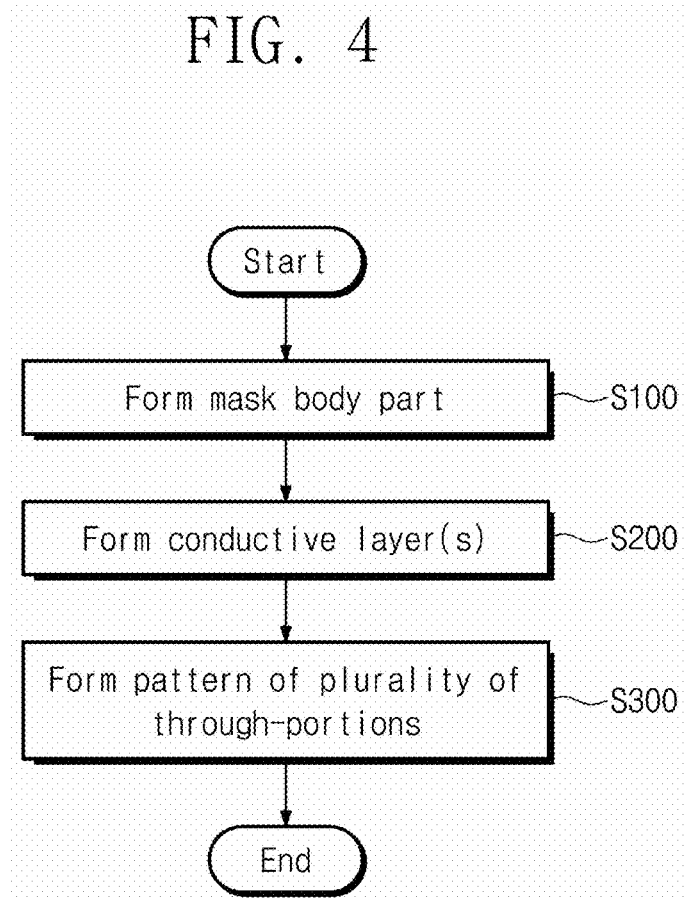

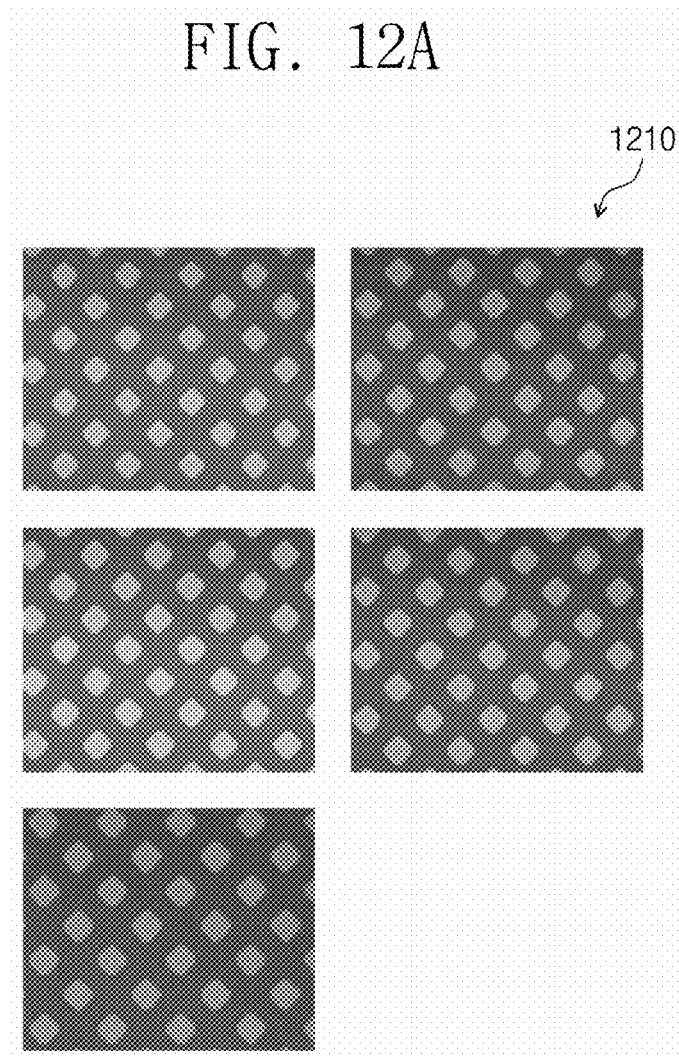

MASK, METHOD FOR MANUFACTURING THE SAME, AND METHOD FOR MANUFACTURING DISPLAY PANEL

CROSS REFERENCE TO RELATED APPLICATION

This application claims priority from and the benefit of Korean Patent Application No. 10-2020-0004066, filed on Jan. 13, 2020, which is hereby incorporated by reference for all purposes as if fully set forth herein.

BACKGROUND

Field

Exemplary embodiments/implementations of the invention relate generally to a mask, a method for manufacturing the same, and a method for manufacturing a display panel and, more specifically, to inventive concepts relating to a mask having an improved process yield and reliability, a method for manufacturing the same, and a method for manufacturing a display panel.

Discussion of the Background

Display panels include a plurality of pixels. Each of the pixels include a driving element such as a transistor and a display element such as an organic light emitting diode. The display element may be formed by laminating an electrode and a light emitting pattern on a substrate.

The light emitting pattern is formed by using a mask in which through-portions are defined to form the light emitting pattern in a predetermined area. The light emitting pattern may be formed in areas exposed by the through-portions. The shape of the light emitting pattern may be controlled according to the shape of the through-portions.

The above information disclosed in this Background section is only for understanding of the background of the inventive concepts, and, therefore, it may contain information that does not constitute prior art.

SUMMARY

Inventive concepts provide a mask having improved reliability in a deposition process and a method for manufacturing a display panel using the same.

Inventive concepts also provide a mask enabling reductions in costs and time for a mask manufacturing process while preventing defects such as shadow from occurring in a deposition process in which the mask is used.

Additional features of the inventive concepts will be set forth in the description which follows, and in part will be apparent from the description, or may be learned by practice of the inventive concepts.

Exemplary embodiments provide a mask having a plurality of cell areas, each of which has a plurality of through-portions defined therein, the mask including a mask film including a polymer; and a conductive layer disposed on at least one surface of the mask film and including conductive metal or a conductive metal oxide.

In an embodiment, the mask film may include polyimide (PI).

In an embodiment, the conductive layer may include at least one of the conductive metal such as nickel (Ni), gold (Au), titanium (Ti), or molybdenum (Mo), or the conductive metal oxide such as an indium tin oxide (ITO) or an indium zinc oxide (IZO).

In an embodiment, the conductive layer may cover each of a top surface and a bottom surface of the mask film.

In an embodiment, the conductive layer may include a first conductive layer disposed on a top surface of the mask film and a second conductive layer disposed on a bottom surface of the mask film.

In an embodiment, the mask film may have a thickness of about 3 μm to about 50 μm.

In an embodiment, the conductive layer may have a thickness of about 3 nm to about 5 μm.

In an embodiment, the mask film may have a plate shape which is parallel to a first direction and a second direction crossing the first direction, and the plurality of cell areas may be arranged spaced apart from each other in the first direction and the second direction.

In an embodiment, the mask may further have extension areas that surround each of the plurality of cell areas. In an embodiment, the plurality of cell areas may be connected to each other by the extension areas.

In an embodiment, the mask may further include an additional mask film which includes the polymer and is disposed spaced apart from the mask film with the conductive layer therebetween.

Exemplary embodiments also provide a method for manufacturing a mask including forming a mask film part using a polymer resin; forming a preliminary conductive layer on at least one surface of the mask film part; and forming a pattern of a plurality of through-portions in the mask film part on which the preliminary conductive layer is formed.

In an embodiment, the polymer resin may include polyimide (PI).

In an embodiment, the forming of the preliminary conductive layer may include forming a first preliminary conductive layer on a carrier substrate using a first conductive material before the forming of the mask film part; and forming a second preliminary conductive layer on the mask film part using a second conductive material after the forming of the mask film part.

In an embodiment, the forming of the pattern of the plurality of through-portions may include patterning the preliminary conductive layer and the mask film part using laser.

In an embodiment, the forming of the pattern of the plurality of through-portions may include a first etching process of etching the preliminary conductive layer; and a second etching process of etching the mask film part.

In an embodiment, the forming of the preliminary conductive layer may be performed by depositing at least one of a conductive metal such as nickel (Ni), gold (Au), titanium (Ti), or molybdenum (Mo), or a conductive metal oxide such as an indium tin oxide (ITO) or an indium zinc oxide (IZO).

In an embodiment, the mask film part may be formed into a plate shape which is parallel to a first direction and a second direction crossing the first direction, and the preliminary conductive layer may be formed to overlap an entire surface of the mask film part.

In an embodiment, the method may further include, before the forming of the pattern of the plurality of through-portions, forming a preliminary additional mask film on the preliminary conductive layer using the polymer resin.

Exemplary embodiments also provide a method for manufacturing a display panel including preparing a target substrate; disposing, under the target substrate, a mask in which a plurality of through-portions are defined; forming, under the target substrate, a plurality of deposition patterns that correspond to the plurality of through-portions; and removing the mask; wherein the mask has the plurality of through-portions defined therein and includes a mask film including a polymer; and a conductive layer disposed on at least one surface of the mask film.

In an embodiment, in the disposing of the mask under the target substrate, an electrostatic chuck may be disposed spaced apart from the mask with the target substrate therebetween.

In an embodiment, in the disposing of the mask under the target substrate, the target substrate and the mask may be in contact with each other.

In an embodiment, the display panel may include a plurality of pixels, and the plurality of deposition patterns may be disposed in the respective pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 4 is a flowchart illustrating a method for manufacturing a mask according to an embodiment of the inventive concept.

FIG. 12A illustrates microscope images of light emitting patterns formed by using a mask according to an embodiment of the inventive concept.

DETAILED DESCRIPTION

Figure 1:
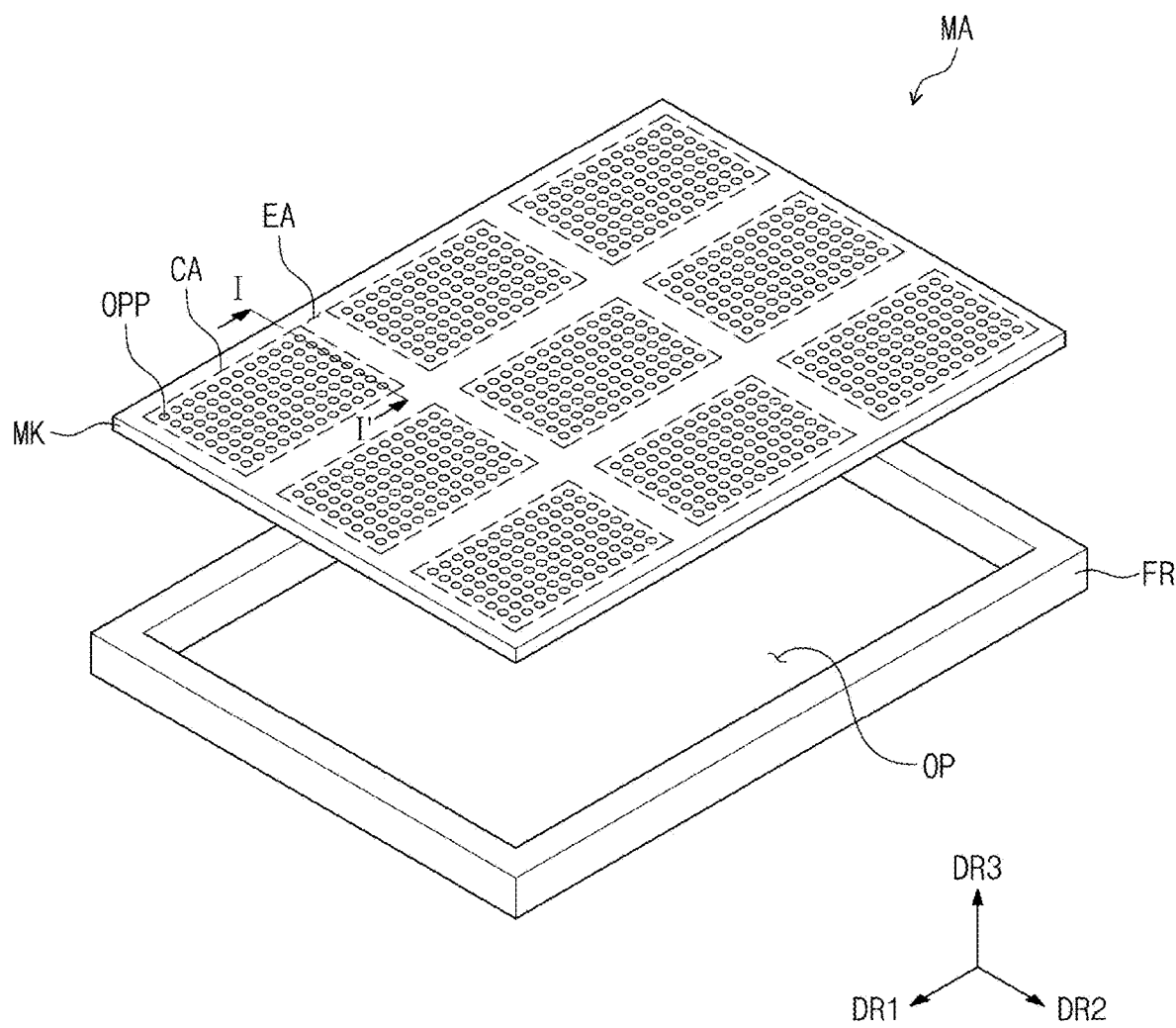
FIG. 1 is an exploded perspective view illustrating a mask assembly according to an embodiment of the inventive concept.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a mask according to an embodiment of the inventive concept will be described with reference to the accompanying drawings.

FIG. 1 is an exploded perspective view illustrating a mask assembly according to an embodiment of the inventive concept.

Referring to FIG. 1, a mask assembly MA may be used in a deposition process to deposit a deposition material. In an embodiment of the inventive concept, the mask assembly MA may include a frame FR and a mask MK.

The top surface of each component is parallel to a plane defined by a first direction DR1 and a second direction DR2. The thickness direction of each component is indicated by a third direction DR3. The upper side (or upper portion) and the lower side (or lower portion) of each component are distinguished from each other by the third direction DR3. However, directions indicated as the first to third directions DR1, DR2, and DR3 have relative concepts and thus may be changed to other directions.

The frame FR may have a ring shape in a plan view. That is, an opening portion OP may be provided in an area including the center of the frame FR. The opening portion OP may be a hole that passes from the top surface of the frame FR to the bottom surface of the frame FR.

A rectangular ring shape is illustrated as an example of the shape of the frame FR in FIG. 1, but the shape of the frame FR is not limited thereto. For example, the frame FR may have various shapes such as a circular ring or a polygonal ring. The frame FR is schematically illustrated as being disposed under the mask MK to support the mask MK in FIG. 1, but the embodiment of the inventive concept is not limited thereto. The frame FR may be disposed in both upper and lower portions of edges of the mask MK to support the mask MK, and may allow the mask MK to extend in the first direction DR1 and the second direction DR2.

The mask MK according to an embodiment may include a plurality of cell areas CA which are arranged in the first direction DR1 and the second direction DR2. In the embodiment, the cell areas CA are illustrated such that three cell areas are disposed spaced apart from each other in each of the first direction DR1 and the second direction DR2, but this is merely illustrated as an example. The mask MK may include more cell areas CA. Also, the cell areas CA may be arranged in only one of the first direction DR1 or the second direction DR2, but are not limited to any one embodiment.

The mask MK according to an embodiment may have a plate shape extending in the first direction DR1 and the second direction DR2. The mask MK may include the plurality of cell areas CA arranged in the first direction DR1 and the second direction DR2 and have an integrated plate shape so that the cell areas CA are connected to each other. The mask MK includes the plurality of cell areas CA and extension areas EA configured to surround each of the cell areas CA, and the cell areas CA are connected to each other by the extension areas EA. Thus, the mask MK may have the integrated plate shape. The mask MK according to an embodiment may not have a stick shape extending in any one of the first direction DR1 or the second direction DR2, but have a plate shape extending in both the first direction DR1 and the second direction DR2. This is because a mask film MF (see FIG. 3A) constituting a main body of the mask MK is made of a polymer material such as polyimide (PI). However, the embodiment of the inventive concept is not limited thereto, and a mask MK according to another embodiment of the inventive concept may have a stick shape in which each of masks extend in any one direction of the first direction DR1 or the second direction DR2, and the masks are spaced in other directions.

A plurality of through-portions OPP may be defined in each of the cell areas CA. The through-portions OPP may be disposed spaced apart from each other in the first direction DR1 and the second direction DR2. Each of the through-portions OPP may be defined as passing through the mask MK in the thickness direction DR3 (hereinafter, referred to as the third direction) of the mask MK.

Figure 2:
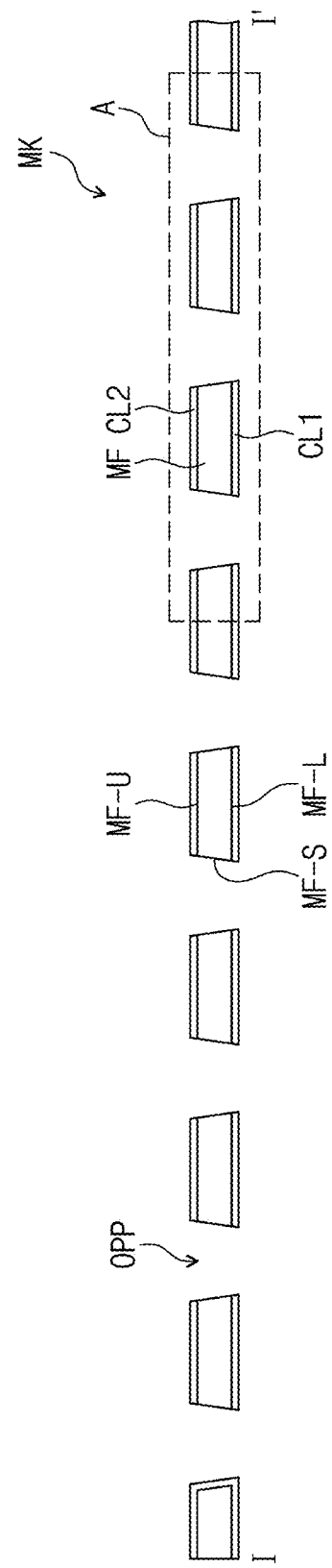
FIG. 2 is a cross-sectional view illustrating a mask according to an embodiment of the inventive concept.
Figure 3A:
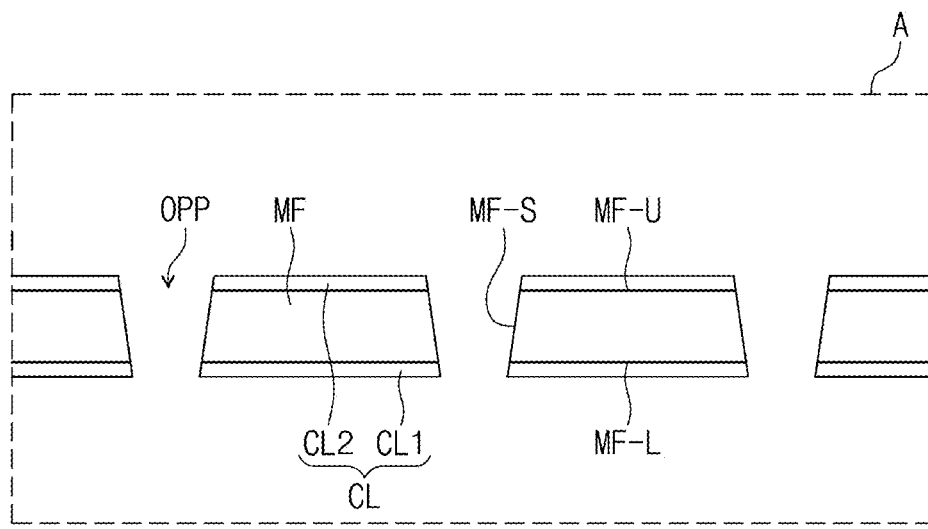
FIGS. 3A to 3E are enlarged cross-sectional views illustrating portions of masks according to embodiments of the inventive concept.

FIG. 2 is a cross-sectional view illustrating a mask according to an embodiment of the inventive concept. FIGS. 3A to 3E are enlarged cross-sectional views illustrating portions of masks according to embodiments of the inventive concept. FIG. 2 illustrates a cross-section corresponding to line I-I' of FIG. 1. FIG. 3A illustrates an enlarged cross-section of section A of FIG. 2. Each of FIGS. 3B to 3E illustrates a portion of a mask according to another embodiment, in a section corresponding to that in FIG. 3A.

As illustrated in FIGS. 1 to 3A, the mask MK includes a mask film MF and a conductive layer CL. The conductive layer CL is disposed on at least one surface of the mask film MF.

At least one through-portion OPP is defined in the mask MK. The plurality of through-portions OPP may be defined in the mask MK. The plurality of through-portions OPP may be disposed spaced a certain distance from each other in the first direction DR1 and/or the second direction DR2, and may create a certain pattern. Each of the plurality of through-portions OPP may be defined as passing through the mask MK in the third direction DR3.

The mask film MF may be made of a polymer resin. In an embodiment, the mask film MF may include polyimide (PI). The mask film MF may be constituted by the polyimide (PI). The mask MK may have the plate shape extending in the first direction DR1 and the second direction DR2.

The thickness of the mask film MF may be about 3 µm to 50 µm. When the thickness of the mask film MF is less than 3 µm, the durability of the mask MK used in a deposition process may be insufficient. When the thickness of the mask film MF is greater than 50 µm, the total thickness of the mask MK increases, which may deteriorate the precision of deposition when the mask MK is used in the deposition process.

The mask MK includes the conductive layer CL disposed on and in contact with at least one surface of the mask film MF. The conductive layer CL may include conductive metal or a conductive metal oxide. In an embodiment, the conductive layer CL may include at least one of the conductive metal such as nickel (Ni), gold (Au), titanium (Ti), or molybdenum (Mo), or the conductive metal oxide such as an indium tin oxide (ITO) or an indium zinc oxide (IZO).

The conductive layer CL may cover at least one surface of the mask film MF. The conductive layer CL may cover both a top surface MF-U and a bottom surface MF-L of the mask film MF. The conductive layer CL may include a first conductive layer CL1 disposed on the bottom surface MF-L of the mask film MF and a second conductive layer CL2 disposed on the top surface MF-U of the mask film MF. Each of the first conductive layer CL1 and the second conductive layer CL2 may include a conductive metal and a conductive metal oxide. The first conductive layer CL1 and the second conductive layer CL2 may cover entire surfaces of the bottom surface MF-L and the top surface MF-U of the mask film MF, respectively. The first conductive layer CL1 may cover the entire surface of the bottom surface MF-L of the mask film MF, and the second conductive layer CL2 may cover the entire surface of the top surface MF-U of the mask film MF.

Inner walls MF-S of the mask film MF are provided by the plurality of through-portions OPP defined in the mask MK, and each of the inner walls MF-S may be exposed without being covered with the upper and lower conductive layers CL. Because the plurality of through-portions OPP are formed after the conductive layer CL is formed on at least one of the top surface MF-U and the bottom surface MF-L of the mask film MF, the inner wall MF-S of the mask film MF may be not covered with a conductive layer, but the inner walls MF-S may be exposed.

The thickness of the conductive layer CL may be about 3 nm to 5 µm. When the thickness of the conductive layer CL is less than 3 nm, an electrostatic force due to an electrostatic induction body such as an electrostatic chuck used in a deposition process is not sufficiently induced on the mask MK. Thus the mask MK and a target substrate may be not in close contact with each other. When the thickness of the conductive layer CL is greater than 5 µm, the total thickness of the mask MK increases, which may deteriorate the precision of deposition when the mask MK is used in the deposition process.

Figure 3B:
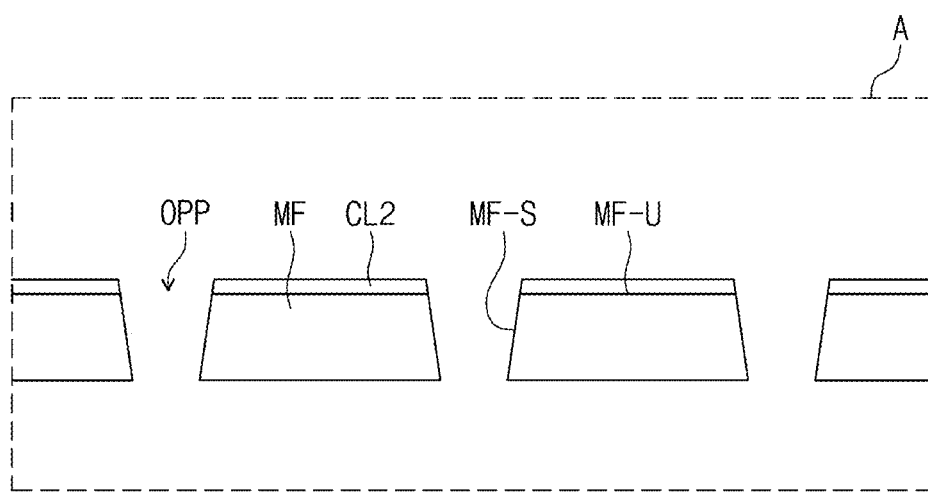
Figure 3C:
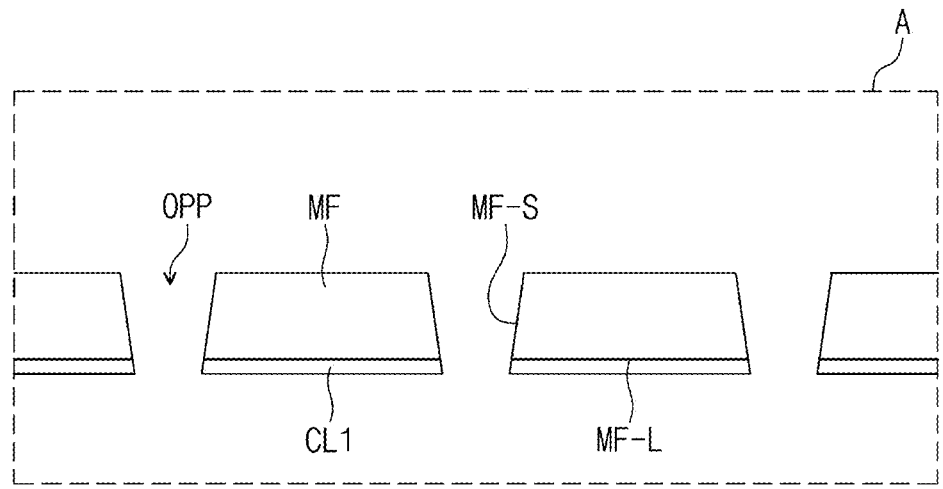

In the mask MK according to an embodiment, the conductive layer CL may be provided on only one of the top surface MF-U or the bottom surface MF-L of the mask film MF. For example, as illustrated in FIG. 3B, a conductive layer CL may include the second conductive layer CL2 disposed on the top surface MF-U of the mask film MF, and the first conductive layer CL1 may be omitted. Also, as illustrated in FIG. 3C, a conductive layer CL may include the first conductive layer CL1 disposed on the bottom surface MF-L of the mask film MF, and the second conductive layer CL2 may be omitted.

Figure 3D:
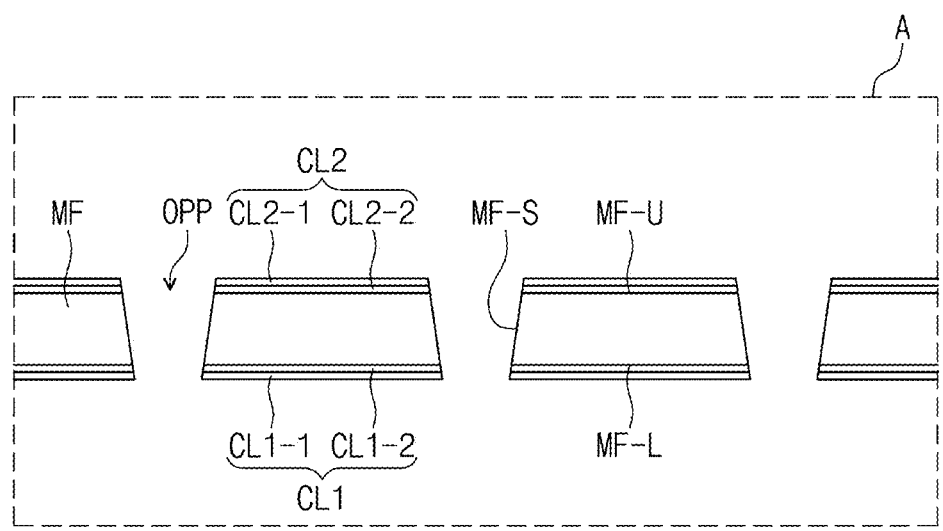

In a mask MK according to an embodiment, a conductive layer CL may be formed to have a plurality of distinct layers. Referring to FIG. 3D, a first conductive layer CL1 disposed on a bottom surface MF-L of a mask film MF may include a first sub-conductive layer CL1-1 and a second sub-conductive layer CL1-2. A second conductive layer CL2 disposed on a top surface MF-U of the mask film MF may include a third sub-conductive layer CL2-1 and a fourth sub-conductive layer CL2-2. The first sub-conductive layer CL1-1 and the second sub-conductive layer CL1-2 may have the same conductive material and conductive metal oxide, or may include different conductive materials and conductive metal oxides. The third sub-conductive layer CL2-1 and the fourth sub-conductive layer CL2-2 may have the same conductive material and conductive metal oxide, or may include different conductive materials and conductive metal oxides.

Figure 3E:
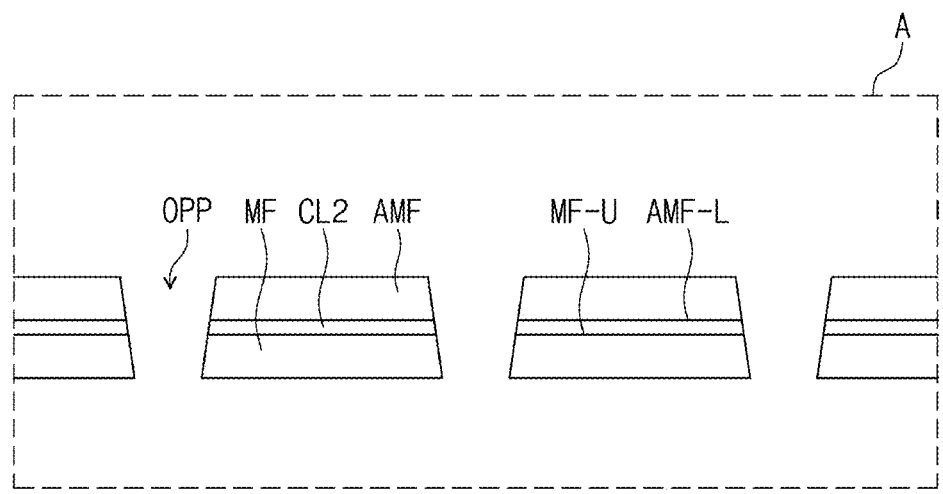

A mask MK according to an embodiment may further include an additional mask film AMF configured to additionally cover a conductive layer CL. Referring to FIG. 3E, the mask MK may further include the additional mask film AMF which is spaced apart from a mask film MF with a second conductive layer CL2 therebetween. The second conductive layer CL2 is disposed between the mask film MF and the additional mask film AMF, and may not be exposed to the outside except for portions exposed by the inside of through-portions OPP. An upper portion and a lower portion of the second conductive layer CL2 may be covered by a top surface MF-U of the mask film MF and a bottom surface AMF-L of the additional mask film AMF, respectively. The upper portion and the lower portion of the conductive layer CL2 are covered as the mask MK includes the additional mask film AMF. A crack may be prevented from occurring in the conductive layer CL2, and the conductive layer CL2 may be prevented from peeling off due to a subsequent cleaning process.

The mask MK according to an embodiment includes the conductive layer CL which is disposed on at least one surface of the mask film MF including polyimide (PI) or the like, and the conductive layer CL includes at least one of the conductive metal such as nickel (Ni), gold (Au), titanium (Ti), or molybdenum (Mo), or the conductive metal oxide such as an indium tin oxide (ITO) or an indium zinc oxide (IZO). Because the mask MK according to an embodiment has the mask film MF made of a polymer resin as a main body, it is possible to form a mask having a smaller thickness than when forming a mask with an alloy such as invar. Also, costs and time in a process of forming the through-portion OPP or the like may be reduced. Also, the mask MK includes the conductive layer CL disposed on at least one surface of the mask film MF, and thus the mask MK and the target substrate may be in contact with each other by a magnetic body in the deposition process. Consequently, shadows that occur in the deposition process are reduced, and thus a more precise deposition process may be achieved.

Hereinafter, a method of manufacturing a mask according to an embodiment of the inventive concept will be described. When describing the method of manufacturing a mask according to an embodiment, the same reference symbols are given to components that are the same as the components described above, and their detailed descriptions will be omitted.

Figure 7A:
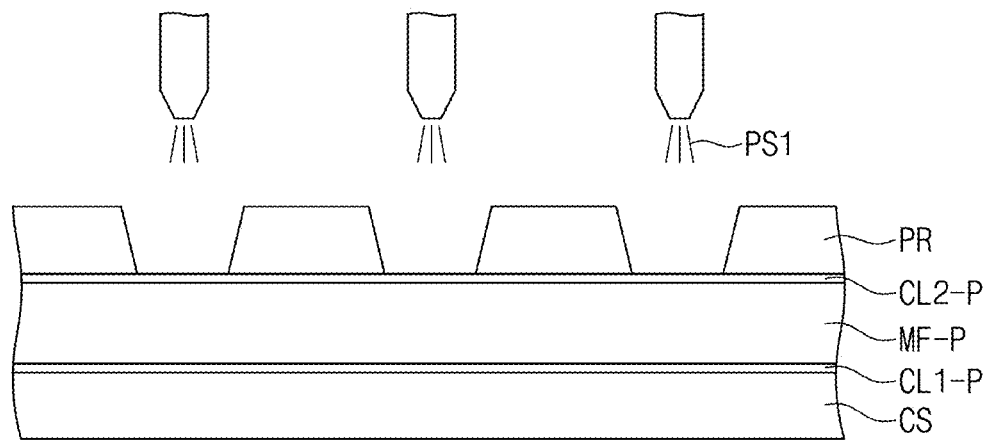
FIGS. 7A to 7C are cross-sectional views sequentially illustrating some processes in a method for manufacturing a mask according to another embodiment of the inventive concept.
Figure 7B:
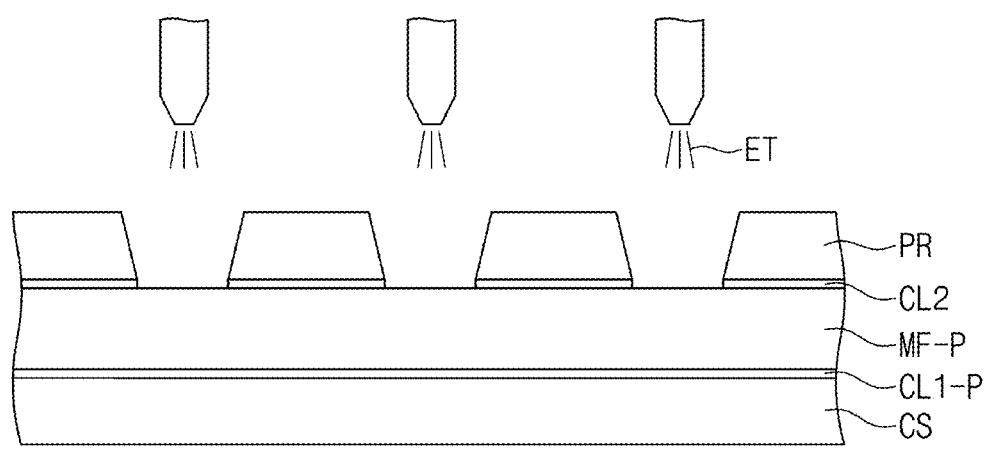
Figure 7C:
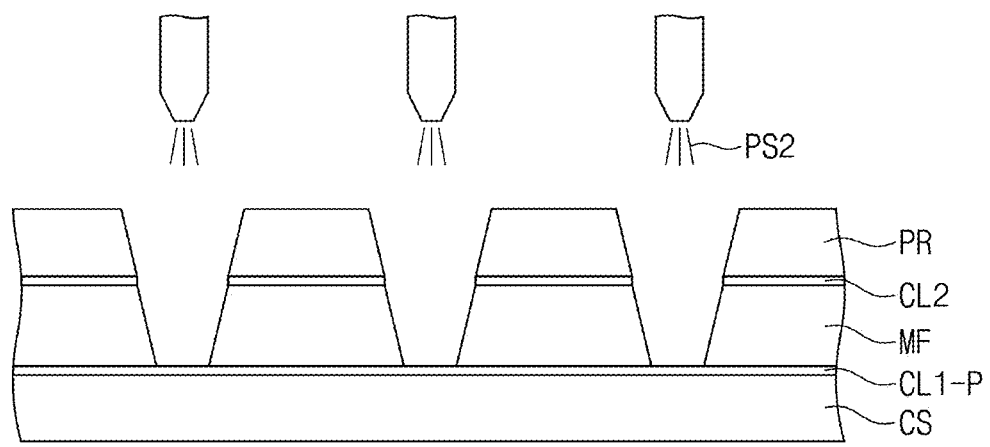

FIG. 4 is a flowchart illustrating a method of manufacturing a mask according to an embodiment of the inventive concept. FIGS. 5A to 5E are cross-sectional views sequentially illustrating a method of manufacturing a mask according to an embodiment of the inventive concept. FIGS. 6A to 6E are cross-sectional views sequentially illustrating a method of manufacturing a mask according to another embodiment of the inventive concept. FIGS. 7A to 7C are cross-sectional views sequentially illustrating some processes in a method of manufacturing a mask according to yet another embodiment of the inventive concept. Each of FIGS. 5A to 5E, FIGS. 6A to 6E, and FIGS. 7A to 7C sequentially illustrates a method of manufacturing a mask according to an embodiment for a section corresponding to the cross-section of the mask illustrated in FIG. 3A. FIGS. 7A to 7C illustrate some of processes of forming a plurality of through-portions in a method of manufacturing a mask according to an embodiment of the inventive concept.

Referring to FIG. 4, a method of manufacturing a mask according to an embodiment includes forming a mask film part (S100), forming one or more conductive layers on at least one surface of the mask film part (S200), and forming a pattern of a plurality of through-portions in the mask film part (S300). The forming (S200) of the one or more conductive layers may include forming a first conductive layer before the forming of the mask film part and forming a second conductive layer after the forming of the mask film part.

Figure 5A:
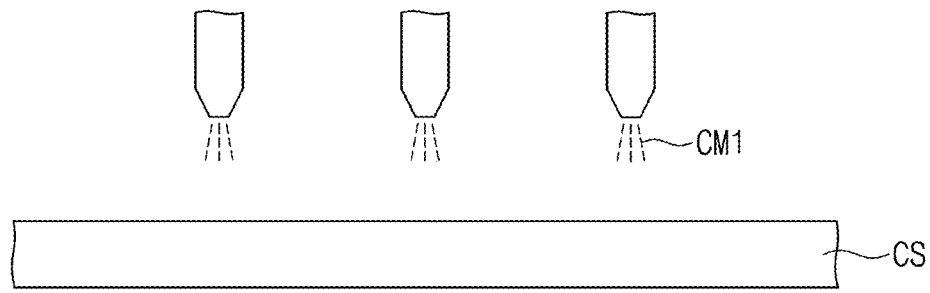
FIGS. 5A to 5E are cross-sectional views sequentially illustrating a method for manufacturing a mask according to an embodiment of the inventive concept.
Figure 5B:
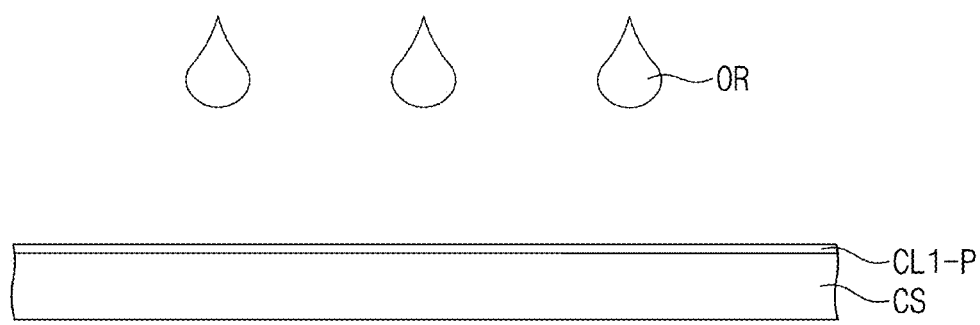

Referring to FIGS. 4, 5A, and 5B together, a preliminary conductive layer is formed by depositing a conductive material on a carrier substrate CS. In an embodiment, a first preliminary conductive layer CL1-P may be formed by using a first conductive material CM1. The first conductive material CM1 may be at least one of a conductive metal such as nickel (Ni), gold (Au), titanium (Ti), or molybdenum (Mo), or a conductive metal oxide such as an indium tin oxide (ITO) or an indium zinc oxide (IZO). The first preliminary conductive layer CL1-P may be formed by depositing the first conductive material CM1. The first preliminary conductive layer CL1-P may be formed by depositing the first conductive material CM1 through a physical deposition process such as sputtering, or a chemical deposition process such as chemical vapor deposition (CVD) or plasma-enhanced chemical vapor deposition (PECVD). Also, a first preliminary conductive layer CL1-P may be formed by plating of a first conductive material CM1.

Figure 5C:
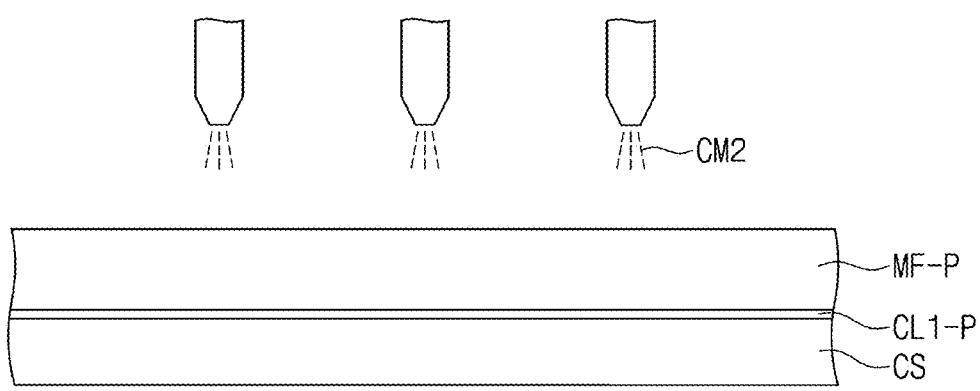

Referring to FIGS. 4, 5B, and 5C together, a mask film part MF-P is formed on the first preliminary conductive layer CL1-P by using a polymer resin OR. The mask film part MF-P may be formed by applying the polymer resin OR such as polyimide (PI). The mask film part MF-P may be formed by applying the polymer resin OR so as to have a plate shape parallel to a first direction DR1 and a second direction DR2. FIGS. 5A to 5C illustrate that the mask film part MF-P may be formed after the first preliminary conductive layer CL1-P is formed on the carrier substrate CS, but the embodiment of the inventive concept is not limited thereto. The first preliminary conductive layer CL1-P may be omitted, and the mask film part MF-P may be formed directly on the carrier substrate CS.

Figure 5D:
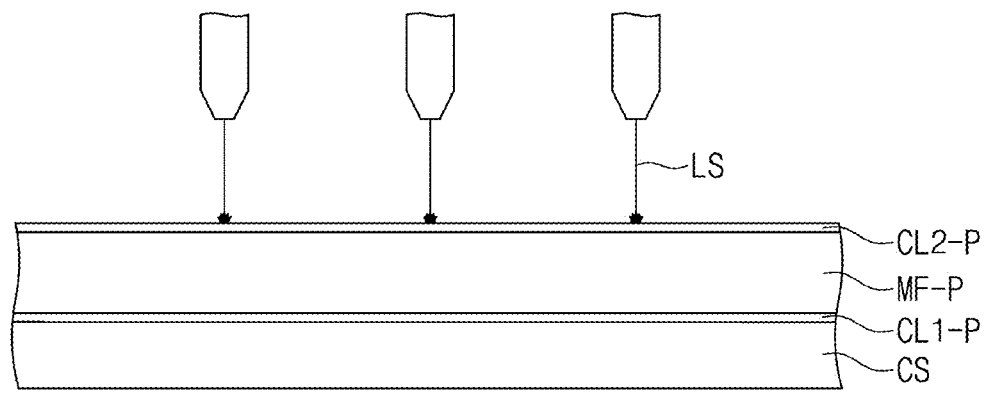

Referring to FIGS. 4, 5C, and 5D together, a second preliminary conductive layer CL2-P may be formed on the mask film part MF-P by using a second conductive material CM2. The second conductive material CM2 may be at least one of a conductive metal such as nickel (Ni), gold (Au), titanium (Ti), or molybdenum (Mo), or a conductive metal oxide such as an indium tin oxide (ITO) or an indium zinc oxide (IZO). The second preliminary conductive layer CL2-P may be formed by depositing the second conductive material CM2. The second preliminary conductive layer CL2-P may be formed by depositing the second conductive material CM2 through a physical deposition process such as sputtering, or a chemical deposition process such as chemical vapor deposition (CVD) or plasma-enhanced chemical vapor deposition (PECVD). Also, a second preliminary conductive layer CL2-P may be formed by plating of a second conductive material CM2. FIGS. 5C and 5D illustrate that the second preliminary conductive layer CL2-P is formed on the mask film part MF-P, but the embodiment of the inventive concept is not limited thereto. The second preliminary conductive layer CL2-P may be omitted. In an embodiment, one of the first preliminary conductive layer CL1-P and the second preliminary conductive layer CL2-P may be omitted. Also, each of the first preliminary conductive layer CL1-P and the second preliminary conductive layer CL2-P may be formed as multi-layers by depositing different materials several times. Also, each of the first preliminary conductive layer CL1-P and the second preliminary conductive layer CL2-P may be formed to overlap the entire surface of the mask film part MF-P. In order to cover the top surface and the bottom surface of the mask film part MF-P having a plate shape, the respective first and second preliminary conductive layers CL1-P and CL2-P may be formed corresponding to the plate shape.

Figure 5E:
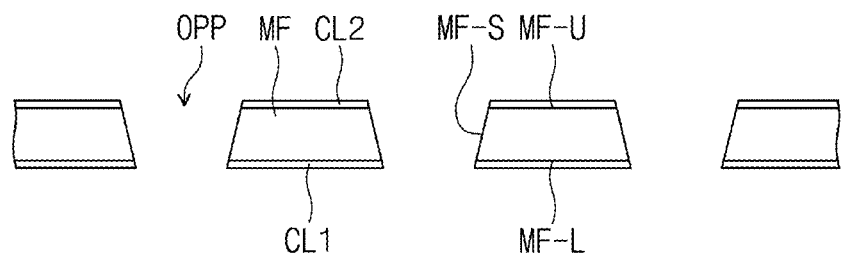
Figure 6A:
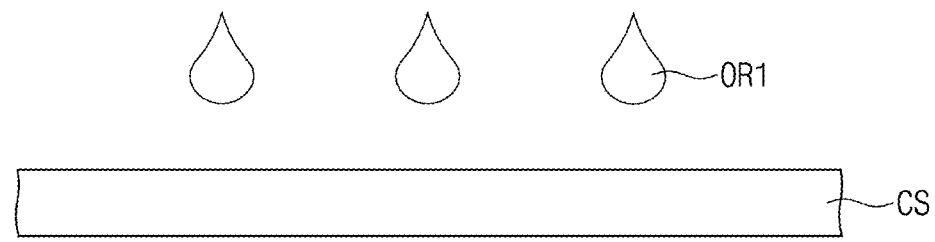
FIGS. 6A to 6E are cross-sectional views sequentially illustrating a method for manufacturing a mask according to another embodiment of the inventive concept.
Figure 6B:
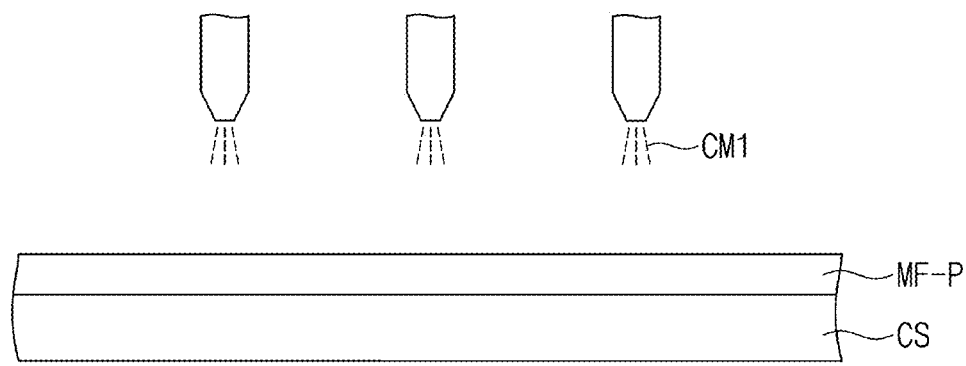
Figure 6C:
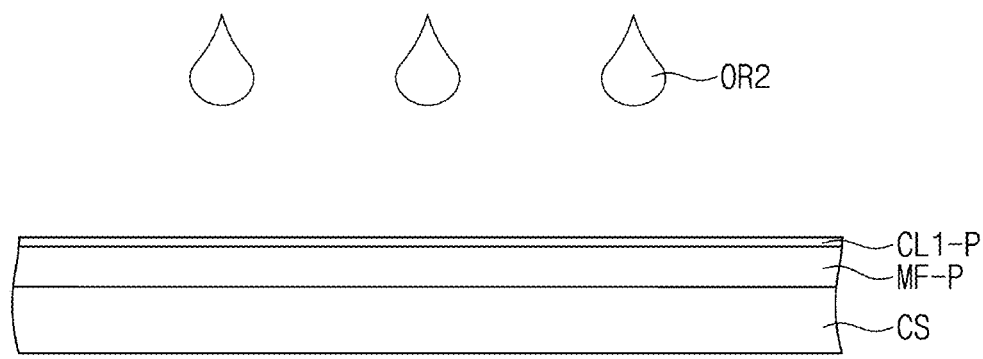
Figure 6D:
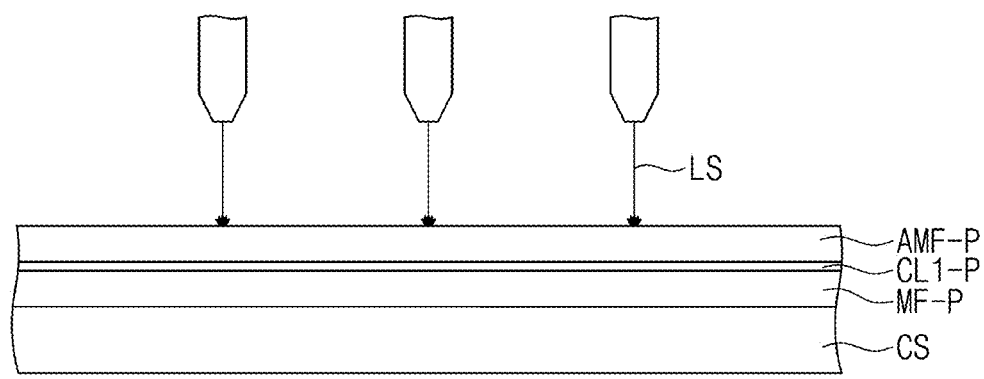
Figure 6E:
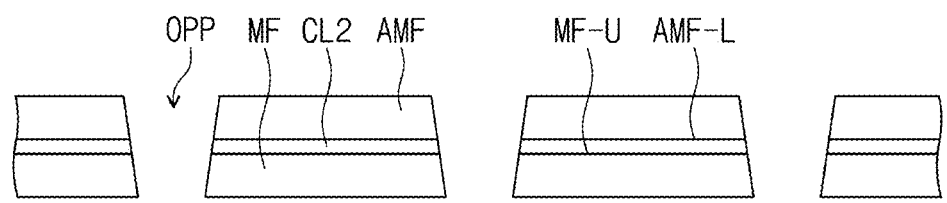

Referring to FIGS. 4, 5D, and 5E together, a pattern of through-portions OPP is formed in the first preliminary conductive layer CL1-P, the second preliminary conductive layer CL2-P, and the mask film part MF-P, and thus a mask film MF having a conductive layer disposed on one surface thereof is formed. Lasers LS are emitted to the mask film part MF-P, in which the first preliminary conductive layer CL1-P and the second preliminary conductive layer CL2-P are respectively disposed on the bottom surface and the top surface, and then the pattern of the plurality of through-portions OPP are formed. As a result, the mask film MF may be formed. The first preliminary conductive layer CL1-P, the second preliminary conductive layer CL2-P, and the mask film part MF-P may be patterned through an irradiation process using the same laser LS, and thus the plurality of through-portions OPP may be formed. The first preliminary conductive layer CL1-P, the second preliminary conductive layer CL2-P, and the mask film part MF-P may be simultaneously patterned through the single laser irradiation process of the laser LS. The method of manufacturing a mask according to the embodiment includes a patterning process of the through-portions OPP using the laser LS, and the mask film part MF-P patterned by using the laser LS is made of the polymer resin OR such as polyimide (PI). Therefore, a processing time of the laser LS may be reduced versus a case of a mask having an alloy such as invar. In addition, an amount of dust generated may be reduced, and a defect in which the dust is adsorbed on the processed surfaces of the through-portions OPP may be reduced. Accordingly, the time and costs in the mask manufacturing process may be reduced, and more reliable mask for deposition may be provided. Also, the polymer resin such as polyimide (PI) has chemical resistance to a cleaning solution such as methylpyrrolidone (NMP) to clean deposition materials, and thus, the mask for deposition, in which a defect is prevented from occurring even in subsequent processes, may be provided. After the process of forming the pattern of the plurality of through-portions OPP, the carrier substrate CS is removed from the mask, and finally the manufacturing of the mask may be finished.

Referring to FIGS. 6A to 6E, a method of manufacturing a mask according to an embodiment may further include forming an additional mask film part AMF-P on a preliminary conductive layer CL1-P using a polymer resin OR2, before the forming of a pattern of a plurality of through-portions OPP. The additional mask film part AMF-P may be formed by applying the polymer resin OR2. More particularly, the method may include sequentially forming a mask film part MF-P, the preliminary conductive layer CL1-P, and the additional mask film part AMF-P on a carrier substrate CS by using a first polymer resin OR1, a conductive material CM1, and a is second polymer resin OR2. The second polymer resin OR2 used to form the additional mask film part AMF-P may have the same material as the first polymer resin OR1 used to form the mask film part MF-P. The first polymer resin OR1 and the second polymer resin OR2 may be the same polyimide (PI).

After the mask film part MF-P, the preliminary conductive layer CL1-P, and the additional mask film part AMF-P are sequentially formed on the carrier substrate CS, a plurality of through-portions OPP may be formed by an irradiation process of lasers LS. The mask film part MF-P, the preliminary conductive layer CL1-P, and the additional mask film part AMF-P may be patterned together by the single laser irradiation process of the lasers LS. After the plurality of the through-portions OPP are formed, the carrier substrate CS is removed from the mask, and the manufacturing of the mask having a conductive layer CL2 (second conductive layer) disposed between a mask film MF and an additional mask film AMF may be completed.

FIGS. 7A to 7C illustrate some of processes of forming a mask film part in a method of manufacturing a mask according to another embodiment of the inventive concept. Hereinafter, when describing the method of manufacturing a mask according to another embodiment of the inventive concept with reference to FIGS. 7A to 7C, the same reference symbols are given to components that are the same as the components described above, and their detailed descriptions will be omitted.

Referring to FIGS. 4 and 7A to 7C, in the forming (S300) of the pattern of the plurality of through-portions in a mask film part, the through-portions may not be formed by the single process using the laser. Instead, the through-portions may be formed by etching each of a first preliminary conductive layer CL1-P, a second preliminary conductive layer CL2-P, and a mask film part MF-P using a plurality of etching processes. In an embodiment, the forming of the pattern of the plurality of through-portions may include a first etching process to etch the preliminary conductive layers and a second etching process to etch the mask film part.

The first etching process may include dry etching processes using plasma gases PS1 and PS2. The second etching process may include a wet etching process using an etchant ET. The forming (S300) of the pattern of the plurality of through-portions according to an embodiment may include forming an etch mask by patterning a photoresist PR, forming a first conductive layer CL1 by etching the first preliminary conductive layer CL1-P using the plasma gas PS1, forming a mask film MF by etching the mask film part MF-P using the etchant ET, and forming a second conductive layer CL-2 by etching the second preliminary conductive layer CL2-P using the second plasma gas PS2.

The mask MK according to the embodiment may have a plate shape in the shape of a trapezoid because the mask film part MF-P is made of the polymer resin OR such as polyimide (PI), and the process of forming the pattern of the plurality of through-portions in the mask film part MF-P may be formed by an etching process for large area patterning. Accordingly, the time and costs in the process of manufacturing the large area mask may be reduced.

Hereinafter, a device and method of manufacturing a display panel using the mask according to the embodiment of the inventive concept will be described. When describing the device and method of manufacturing a display panel according to an embodiment, the same reference symbols are given to components that are the same as the components described above, and their detailed descriptions will be omitted.

Figure 8:
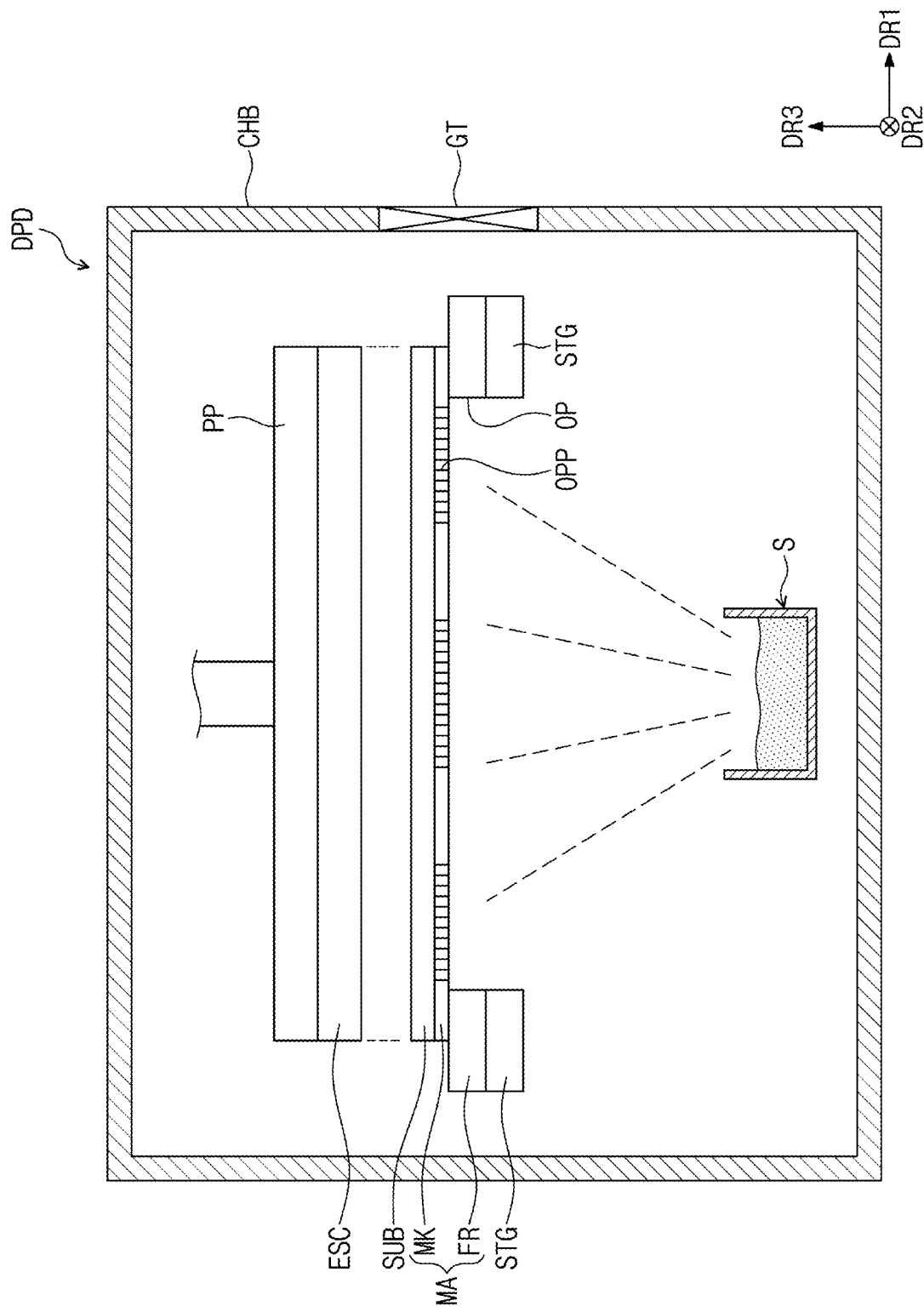
FIG. 8 is a cross-sectional view illustrating a deposition device according to an embodiment of the inventive concept.

FIG. 8 is a cross-sectional view illustrating a deposition device according to an embodiment of the inventive concept.

Referring to FIG. 8, a deposition device DPD may include a chamber CHB, a deposition source S, a stage STG, a moving plate PP, and a mask assembly MA.

The chamber CHB provides a sealed space. The deposition source S, the stage STG, the moving plate PP, and the mask assembly MA may be disposed within the chamber CHB. The chamber CHB may include at least one gate GT. The chamber CHB may be opened and closed by the gate GT. A target substrate SUB may enter through the gate GT provided in the chamber CHB.

The deposition source S includes a deposition material. The deposition material may be a material which is sublimated or vaporized and include one or more of an inorganic substance, metal, or an organic substance. The deposition source S according to an embodiment is illustratively described as a case including the organic substance of manufacturing an organic light emitting device (OLED, see FIG. 9).

The stage STG is disposed above the deposition source S. The mask assembly MA may be seated on the stage STG. The mask assembly MA may face the deposition source S. The mask assembly MA may include the mask MK and a frame FR. The stage STG may overlap the frame FR of the mask assembly MA in the DR3 direction and thus may support the mask assembly MA. The stage STG does not overlap an opening portion OP adjacent the frame FR. That is, the stage STG may be disposed in the outside of a moving path of the deposition material which is supplied from the deposition source S to the target substrate SUB.

As illustrated, the target substrate SUB is disposed on the mask assembly MA. The deposition material passes through a plurality of through-portions OPP and then may be deposited on the target substrate SUB.

The moving plate PP may allow the target substrate SUB to be aligned on the mask assembly MA. The moving plate PP may move in up/down or left/right directions. An electrostatic induction body such as an electrostatic chuck ESC may be disposed on the moving plate PP according to an embodiment. The electrostatic chuck ESC may include a main body which is made of ceramic or the like and an electrode which is built within the main body and to which power is applied. As voltage is applied to the electrode of the electrostatic chuck ESC, an electrostatic force is induced. Thus, an attractive force due to the electrostatic force may be applied to a conductive layer. In the deposition device according to an embodiment, the target substrate SUB may be moved by the electrostatic force, and a mask MK may be brought into contact with a lower portion of the target substrate SUB by the electrostatic force. Because the electrostatic chuck ESC is disposed in the moving plate PP according to the embodiment of the inventive concept, the target substrate SUB may be fixed on the mask assembly MA, and the mask MK is disposed to be in close contact with the target substrate SUB. Therefore, the precision of the deposition process may be further enhanced.

Figure 9A:
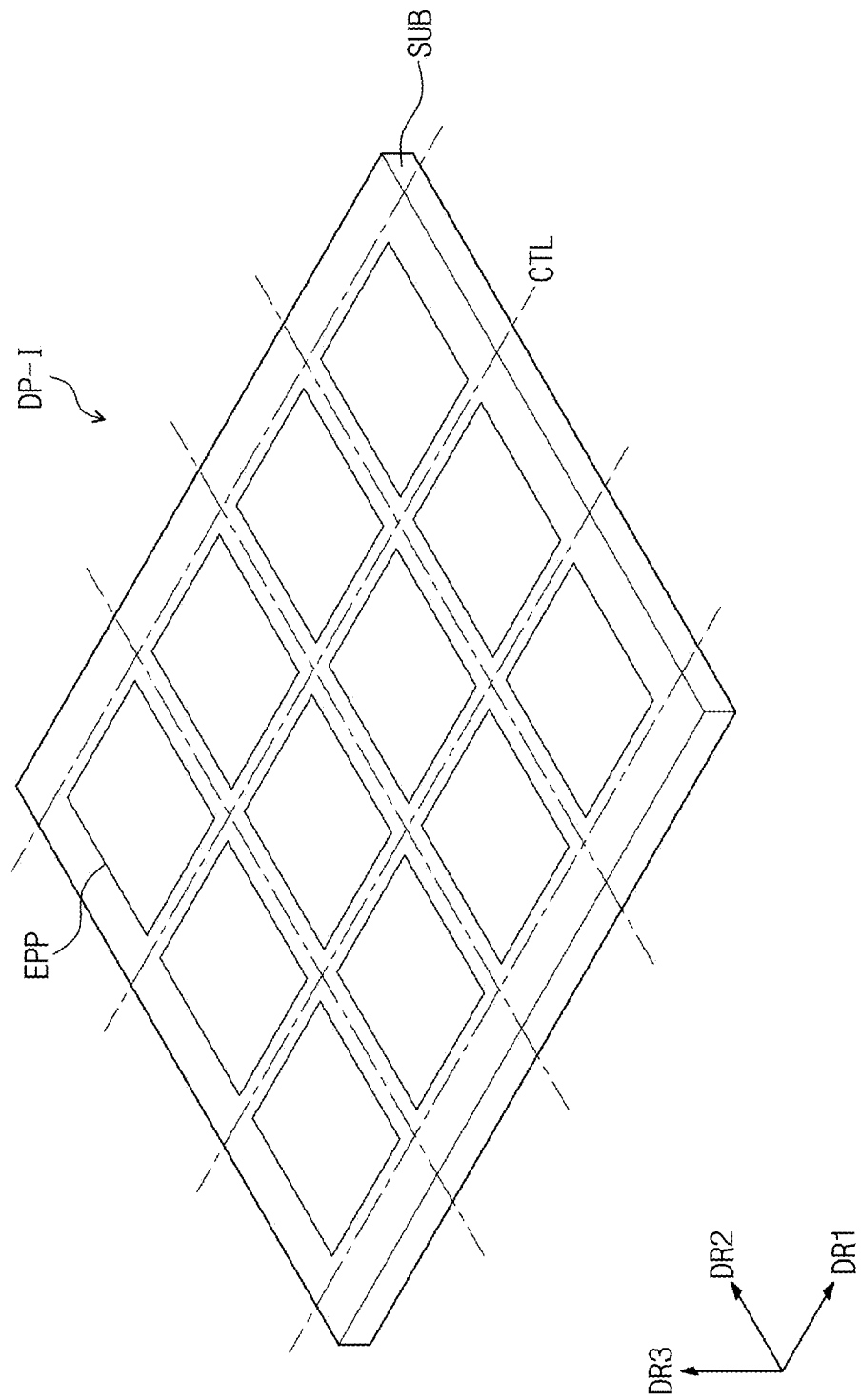
FIGS. 9A to 9C are schematic perspective views illustrating some processes in a method for manufacturing a display panel according to an embodiment of the inventive concept.
Figure 9B:
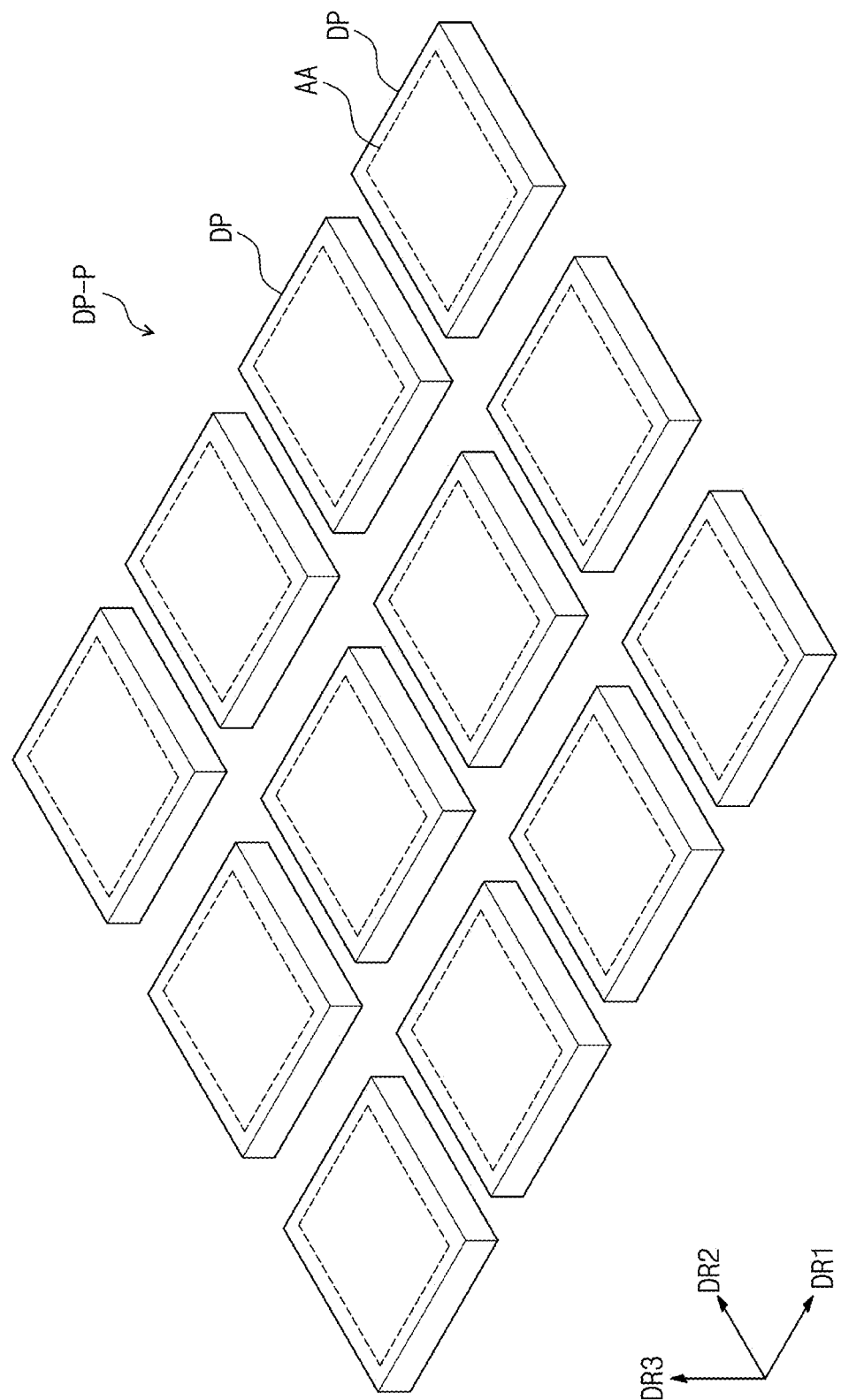
Figure 9C:
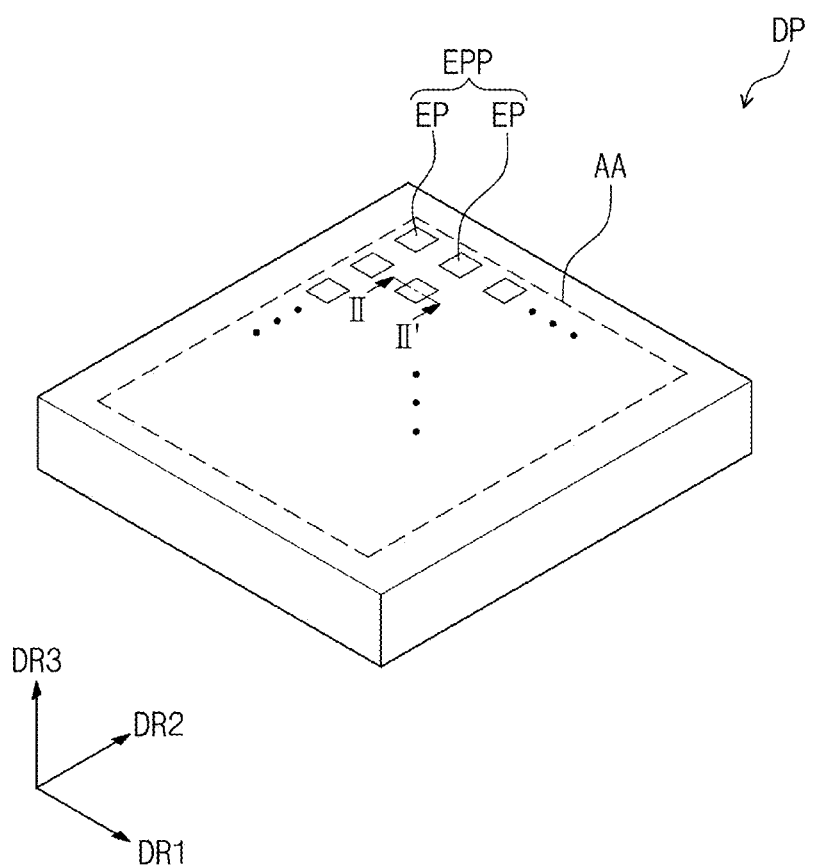

FIGS. 9A to 9C are schematic perspective views illustrating some processes in a method of manufacturing a display panel according to an embodiment of the inventive concept.

Referring to FIGS. 1, 8, and 9A together, the deposition material is deposited on the target substrate SUB by the deposition device DPD, and then the mask assembly MA may be removed. An initial substrate DP-I in which the mask assembly MA is removed is in a state in which light emitting pattern layers EPP are formed on the target substrate SUB. The light emitting pattern layers EPP may be formed corresponding to cell areas CA of the mask MK. Each of the light emitting pattern layers EPP may include a plurality of light emitting patterns which are not illustrated herein.

Referring to FIGS. 9A and 9B, the initial substrate DP-I in which the mask assembly MA is removed is cut along cutting lines CTL defined in the initial substrate DP-I in which the mask assembly MA is removed, and is then separated into a plurality of panels DP-P. A display panel DP is formed by each of the panels DP-P.

According to the embodiment of the inventive concept, the plurality of display panels DP may be formed by patterning the target substrate SUB. Also, because the mask configured to form the display panel according to the embodiment includes a mask body formed of the polymer material such as polyimide (PI), a large mask process suitable to form the plurality of display panels DP may be performed. Thus, the process time may be reduced, and the process costs may be saved. However, the embodiment of the inventive concept is not limited thereto, and in another embodiment of the inventive concept, one display panel DP may be obtained from the target substrate SUB according to the size of the display panel DP.

Referring to FIG. 9C, the display panel DP may include at least one active area AA. The active area AA may include a plurality of pixels. The active area AA may correspond to an area in which the light emitting pattern layer EPP is disposed, and light emitting patterns EP may correspond to the plurality of pixels, respectively. The light emitting patterns EP may be formed corresponding to the through-portions OPP of the mask MK, respectively. In this specification, the light emitting patterns EP may be referred to as deposition patterns.

Figure 10:
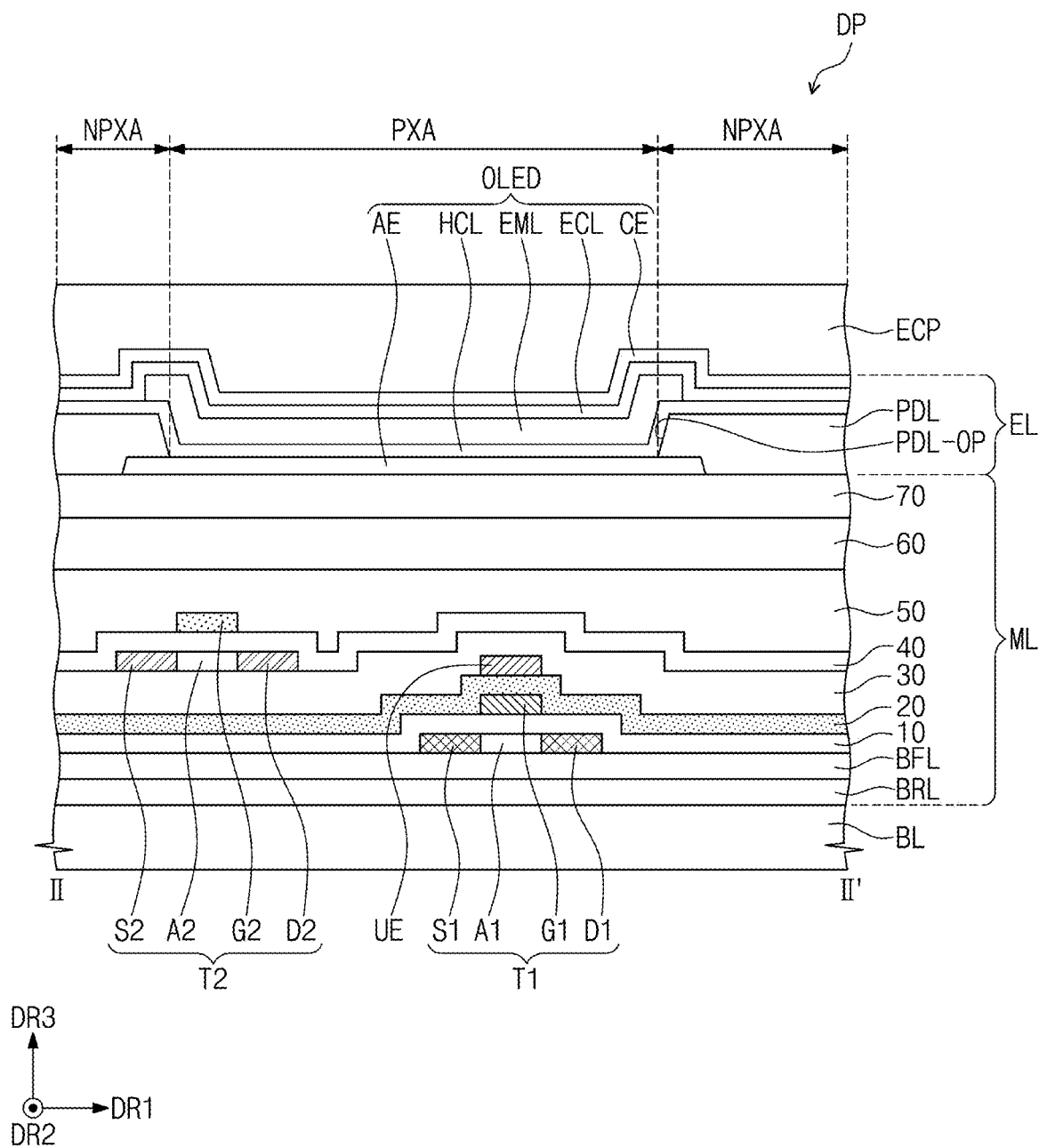
FIG. 10 is a cross-sectional view illustrating a display panel according to an embodiment of the inventive concept.

FIG. 10 is a cross-sectional view illustrating a display panel according to an embodiment of the inventive concept. FIG. 10 illustrates a portion of the display panel in a cross-section corresponding to line II-II' of FIG. 9C.

Referring to FIG. 10, in an embodiment of the inventive concept, a display panel DP may be a light emitting display panel. FIG. 10 illustrates the cross-section corresponding to one of the plurality of pixels and the cross-section corresponding to two transistors T1 and T2 and a light emitting element OLED.

As illustrated in FIG. 10, the display panel DP includes a base layer BL, a circuit element layer ML disposed on the base layer BL, a display element layer EL disposed on the circuit element layer ML, and an encapsulating insulating layer ECP (hereinafter, defined as an upper insulating layer) disposed on the display element layer EL.

The base layer BL may include a synthetic resin layer. The base layer BL may be formed by forming a synthetic resin layer on a support substrate used in manufacturing the display panel DP, forming a conductive layer and an insulating layer on the synthetic resin layer, and then removing the support substrate.

The circuit element layer ML may include at least one insulating layer and a circuit element. The circuit element includes a signal line, a driving circuit of a pixel, or the like. The circuit element layer ML may be formed through a process of forming an insulating layer, a semiconductor layer, and a conductive layer using coating, deposition, or the like and a process of patterning an insulating layer, a semiconductor layer, and a conductive layer using a photolithography process.

In the embodiment, the circuit element layer ML includes a buffer layer BFL, a barrier layer BRL, and first to seventh insulating layers 10, 20, 30, 40, 50, 60, and 70. The buffer layer BFL, the barrier layer BRL, and the first to seventh insulating layers 10, 20, 30, 40, 50, 60, and 70 may include one of an inorganic layer or an organic layer. The buffer layer BFL and the barrier layer BRL may include an inorganic layer. At least one of the fifth to seventh insulating layers 50, 60, and 70 may include an organic layer.

FIG. 10 illustrates the arrangement relationship of a first active A1, a second active A2, a first gate G1, second gate G2, a first source S1, an upper electrode UE, a second source S2, a first drain D1, and a second drain D2 which constitute the first and second transistors T1 and T2. In the embodiment, the first active A1 and the second active A2 may include different materials. The first active A1 may include a polysilicon semiconductor, and the second active A2 may include a metal oxide semiconductor. Each of the first source S1 and the first drain D1 is an area having higher doping concentration than the first active A1, and functions as an electrode. Each of the second source S2 and the second drain D2 is an area in which the metal oxide semiconductor is reduced, and functions as an electrode.

In an embodiment of the inventive concept, the first active A1 and the second active A2 may include the same semiconductor material, and in this case, the laminate structure of the circuit element layer ML may be further simplified.

The display element layer EL includes a pixel defining layer PDL and the light emitting element OLED. The light emitting element OLED may be an organic light emitting diode or a quantum dot light emitting diode. An anode AE is disposed on the seventh insulating layer 70. At least a portion of the anode AE is exposed through an opening portion PDL-OP of the pixel defining layer PDL. The opening portion PDL-OP of the pixel defining layer PDL may define a light emitting area PXA. The light emitting area PXA may be surrounded by a non-light emitting area NPXA.

A hole control layer HCL and an electron control layer ECL may be commonly disposed in all of the light emitting area PXA and the non-light emitting area NPXA. A light emitting layer EML may be provided as a pattern shape so as to correspond to the opening portion PDL-OP. The light emitting layer EML may be deposited in a different method from the deposition of the hole control layer HCL and the electron control layer ECL having layer shapes. The hole control layer HCL and the electron control layer ECL may be commonly formed in all the plurality of pixels by using an open mask. The light emitting layer EML may be formed into a pattern shape by using the mask according to the embodiment of the inventive concept so as to correspond to the opening portion PDL-OP. However, the embodiment of the inventive concept is not limited thereto. As in the light emitting layer EML, each of the hole control layer HCL and the electron control layer ECL may also be formed into a pattern shape by using the mask according to the embodiment of the inventive concept so as to correspond to the opening portion PDL-OP.

A cathode CE is disposed on the electron control layer ECL. The upper insulating layer ECP is disposed on the cathode CE. The upper insulating layer ECP may be a thin film encapsulation (TFE) layer to encapsulate the display element layer EL. The upper insulating layer ECP may include a plurality of thin films. The plurality of thin films may include an inorganic layer and an organic layer. The upper insulating layer ECP may include an insulating layer to encapsulate the display element layer EL and a plurality of insulating layers to improve the light emitting efficiency.

Figure 11A:
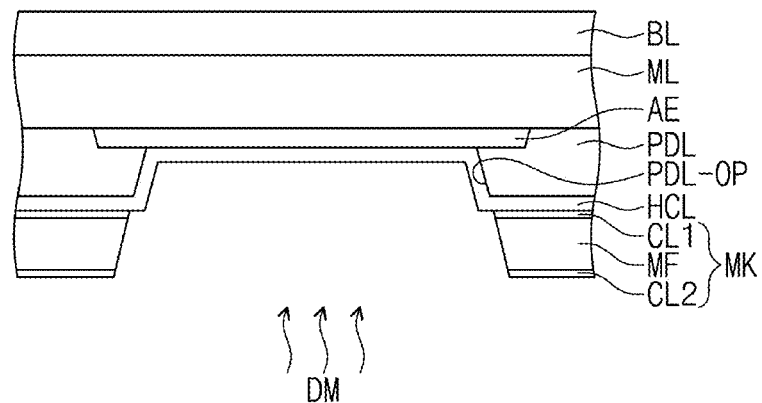
FIGS. 11A and 11B are cross-sectional views sequentially illustrating some processes in a method for manufacturing a display panel according to an embodiment of the inventive concept.
Figure 11B:
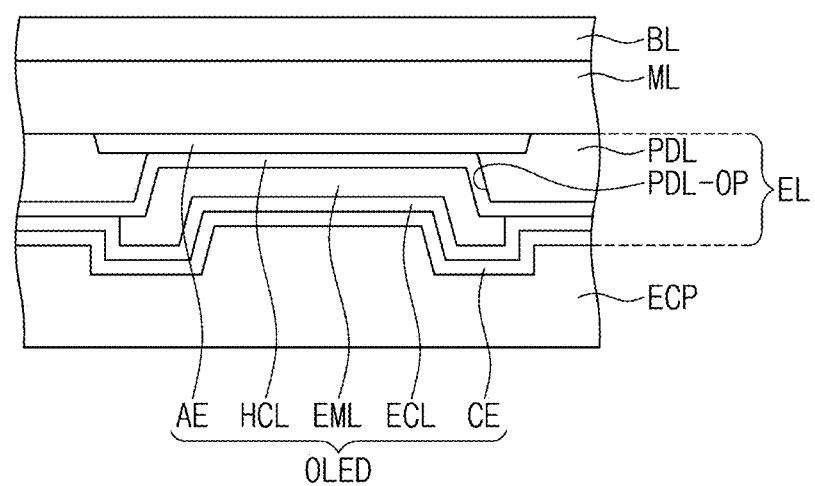

FIGS. 11A and 11B are cross-sectional views sequentially illustrating some processes in a method of manufacturing a display panel according to an embodiment of the inventive concept. FIGS. 11A and 11B sequentially illustrate processes of forming a display element layer in the method of manufacturing a display panel according to an embodiment.

Referring to FIGS. 8, 10, 11A, and 11B together, a light emitting layer EML in the method of manufacturing a display panel according to an embodiment may be formed into a pattern shape by the mask MK so as to correspond to the opening portion PDL-OP. More particularly, the light emitting layer EML may be formed within the deposition device DPD by patterning a deposition material DM, deposited upward from the deposition source S, using the mask MK to correspond to an inside of the opening portion PDL-OP. In the patterning of the light emitting layer EML, the mask MK may be brought into contact with the target substrate SUB by the electrostatic chuck ESC included in the deposition device DPD. That is, the electrostatic attractive force of the electrostatic chuck ESC is induced through at least one conductive layer, such as the first conductive layer CL1 and the second conductive layer CL2, disposed on one surface of the mask film MF of the mask MK. Thus, the patterning of the light emitting layer EML may be performed in a state in which the mask MK is in contact with some components (the pixel defining layer PDL in the embodiment) of the target substrate SUB. FIG. 11A illustrates that the mask MK has the structure illustrated in FIG. 3A, but the embodiment of the inventive concept is not limited thereto. The mask MK used in the deposition process may also have structures according to other embodiments illustrated in FIGS. 3B to 3E.

When a polymer mask according to some designs are used, deflection of the mask may occur due to lower strength than a metal mask. Accordingly, a gap is created between the mask and the target substrate, and shadow may significantly occur when the deposition pattern is formed. However, in a method of manufacturing a display panel using the mask according to the embodiment of the inventive concept, at least one conductive layer disposed on the one surface of the mask film MF of the mask MK is provided, and the deposition process may be performed in a state in which the mask MK is in contact with the target substrate SUB. Accordingly, the shadow may be prevented from occurring in the deposition process of the light emitting pattern, and the more precise deposition process may be achieved.

Figure 12B:
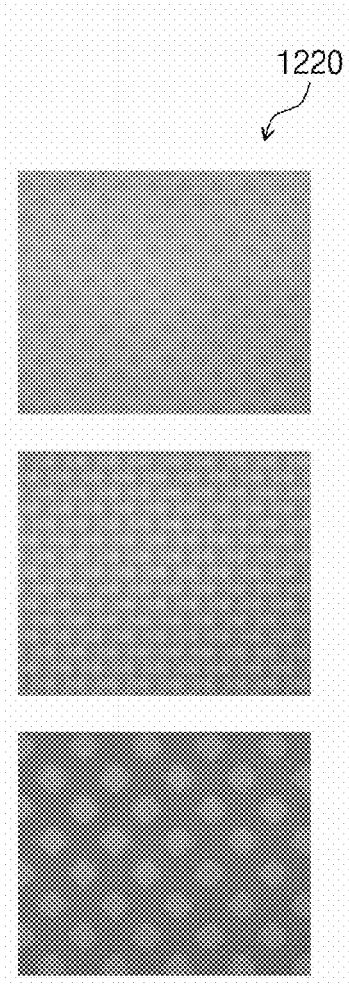
FIG. 12B illustrates microscope images of light emitting patterns formed by using a mask according to an comparative example.

FIG. 12A illustrates microscope images of light emitting patterns formed by using a mask according to an embodiment of the inventive concept. FIG. 12B are microscope images of light emitting patterns formed by using a mask according to an comparative example. FIG. 12A illustrates images of the light emitting patterns 1210 which are formed by forming a conductive layer on one surface of the mask film and then depositing an organic material in a state in which the electrostatic attractive force is induced by the electrostatic chuck, as in an embodiment of the inventive concept. FIG. 12B illustrates images of the light emitting patterns 1220 which are formed in a state in which the electrostatic attractive force is not induced by the electrostatic chuck, unlike in the embodiment of the inventive concept.

Referring to results of FIGS. 12A and 12B, it may be found that, in the deposition process of the light emitting patterns 1220 using the mask according to the comparative example, shadow is widely generated, which may cause deterioration in pixel precision, short circuit due to the shadow, cracks, or the like. However, it may be found that, when the mask according to the embodiment of the inventive concept is used, the shadow is prevented from occurring in the deposition process of the light emitting patterns 1210, thereby improving the deposition precision and making it possible to more precisely form the pixels.

According to the embodiment of the inventive concept, shadows are prevented from being generated in the deposition of light emitting patterns while reducing the time and costs in the manufacturing process of the mask configured to form the light emitting patterns or the like. Thus, defects may be prevented from occurring in display panels formed by using the mask.

Although described with reference to the exemplary embodiments of the inventive concepts, it will be understood that various changes and modifications of the inventive concepts may be made by one skilled in the art or one having ordinary knowledge in the art without departing from the spirit and technical field of the inventive concepts as hereinafter claimed.

Hence, the technical scope of the inventive concepts is not limited to the detailed descriptions in the specification, but it should be determined only by reference of the claims.

What is claimed is:

1. A mask having a plurality of cell areas, each of which has a plurality of through-portions defined therein, the mask comprising:
   a mask film comprising a polymer; and
   a conductive layer disposed on at least one surface of the mask film and comprising conductive metal or a conductive metal oxide,
      wherein the conductive layer covers each of a top surface and a bottom surface of the mask film.

2. The mask of claim 1, wherein the mask film comprises polyimide (PI).

3. The mask of claim 1, wherein the conductive layer comprises at least one of the conductive metal that includes nickel (Ni), gold (Au), titanium (Ti), or molybdenum (Mo), or the conductive metal oxide that includes an indium tin oxide (ITO) or an indium zinc oxide (IZO).

4. The mask of claim 1, wherein the mask film has a thickness of about 3 μm to about 50 μm.

5. The mask of claim 1, wherein the conductive layer has a thickness of about 3 nm to about 5 μm.

6. The mask of claim 1, wherein the mask film has a plate shape which is parallel to a first direction and a second direction crossing the first direction, and
   the plurality of cell areas are arranged spaced apart from each other in the first direction and the second direction.

7. The mask of claim 6, further having extension areas that surround each of the plurality of cell areas,
   wherein the plurality of cell areas are connected to each other by the extension areas.

8. A mask having a plurality of cell areas, each of which has a plurality of through-portions defined therein, the mask comprising:
   a mask film comprising a polymer; and
   a conductive layer disposed on at least one surface of the mask film and comprising conductive metal or a conductive metal oxide,
   wherein the conductive layer comprises a first conductive layer disposed on a top surface of the mask film and a second conductive layer disposed on a bottom surface of the mask film.

9. A mask having a plurality of cell areas, each of which has a plurality of through-portions defined therein, the mask comprising:
   a mask film comprising a polymer;
   a conductive layer disposed on at least one surface of the mask film and comprising conductive metal or a conductive metal oxide; and
   an additional mask film which comprises the polymer and is disposed spaced apart from the mask film with the conductive layer therebetween.

10. A method of manufacturing a mask, the method comprising:
    forming a mask film part using a polymer resin;
    forming a preliminary conductive layer on at least one surface of the mask film part; and
    forming a pattern of a plurality of through-portions in the mask film part on which the preliminary conductive layer is formed,
    wherein the forming of the preliminary conductive layer comprises:
      forming a first preliminary conductive layer on a carrier substrate using a first conductive material before the forming of the mask film part; and
      forming a second preliminary conductive layer on the mask film part using a second conductive material after the forming of the mask film part.

11. The method of claim 10, wherein the polymer resin comprises polyimide (PI).

12. The method of claim 10, wherein the forming of the pattern of the plurality of through-portions comprises patterning the preliminary conductive layer and the mask film part using laser.

13. The method of claim 10, wherein the forming of the pattern of the plurality of through-portions comprises:
    a first etching process of etching the preliminary conductive layer; and
    a second etching process of etching the mask film part.

14. The method of claim 10, wherein the forming of the preliminary conductive layer is performed by depositing at least one of a conductive metal that includes nickel (Ni), gold (Au), titanium (Ti), or molybdenum (Mo), or a conductive metal oxide that includes an indium tin oxide (ITO) or an indium zinc oxide (IZO).

15. The method of claim 10, wherein the mask film part is formed into a plate shape which is parallel to a first direction and a second direction crossing the first direction, and
    the preliminary conductive layer is formed to overlap an entire surface of the mask film part.

16. A method of manufacturing a mask, the method comprising:
    forming a mask film part using a polymer resin;
    forming a preliminary conductive layer on at least one surface of the mask film part;
    forming an additional mask film part on the preliminary conductive layer using the polymer resin; and
    forming a pattern of a plurality of through-portions in the mask film part on which the preliminary conductive layer is formed.

* * * * *